United States Patent [19]
Kushi et al.

[11] Patent Number: 5,284,736
[45] Date of Patent: Feb. 8, 1994

[54] FLAME-RESISTANT PHOTO-CURABLE RESIN COMPOSITION

[75] Inventors: Kenji Kushi; Ken-ichi Inukai, both of Otake, Japan

[73] Assignee: Mitsubishi Rayon Co., Ltd., Tokyo, Japan

[21] Appl. No.: 801,386

[22] Filed: Dec. 2, 1991

[30] Foreign Application Priority Data

Nov. 30, 1990 [JP] Japan .................. 2-335790
Oct. 11, 1991 [JP] Japan .................. 3-263770

[51] Int. Cl.$^5$ .................. C08F 2/50; C08F 265/06; G03F 7/033
[52] U.S. Cl. .................. 430/283; 522/81; 522/121; 525/296
[58] Field of Search ............ 430/281, 283; 522/120, 522/121, 81

[56] References Cited

U.S. PATENT DOCUMENTS

| | | | |
|---|---|---|---|
| 4,278,752 | 2/1980 | Gervay | 522/121 |
| 4,544,625 | 10/1985 | Ishimaru | 430/281 |
| 4,942,112 | 7/1990 | Monroe | 522/120 |
| 4,970,135 | 11/1990 | Kushi | 430/281 |
| 4,985,343 | 1/1991 | Kushi | 430/281 |

FOREIGN PATENT DOCUMENTS 0361409 4/1990 European Pat. Off. .
0382524 8/1990 European Pat. Off. .

OTHER PUBLICATIONS

Chemical Abstracts, vol. 91 No. 6, Aug. 6, 1979 Columbus, Ohio, US.
Abstract No. 47376 Tatsugi S. et al. Combustion-Resistant Photosensitive Resin Composition for Solder Resists pp. 534 col. 1.

*Primary Examiner*—Marion E. McCamish
*Assistant Examiner*—Arthur H. Koeckert
*Attorney, Agent, or Firm*—Oblon, Spivak, McClelland, Maier & Neustadt

[57] ABSTRACT

A flame-resistant, photo-curing resin composition of the present invention consists of:

(a) 35 to 65 parts by weight of an acrylic thermoplastic polymer, the acrylic thermoplastic polymer being 15 to 30% by weight copolymerized with at least one of monomer containing an alpha, beta-unsaturated carboxyl group, (b) 5 to 30 parts by weight of a bromine-substituted monomer represented by a general formula [I]:

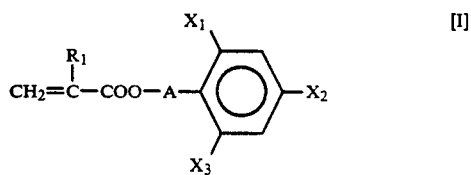

wherein
$R_1$ is H or $CH_3$,
A is

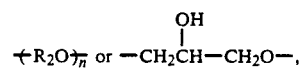

wherein $R_2$ is an alkylene group containing two or three carbon atoms,
n is an integer between 1 and 4, and
$X_1$, $X_2$, and $X_3$ are Br or H, under a condition that at least two of the $X_1$, $X_2$, and $X_3$ are Br, (c) 0 to 10 parts by weight of antimony trioxide particles with an average diameter of 0.1 μm or smaller,
(d) 20 to 50 parts by weight of a vinyl monomer, excluding component (b), and
(e) 0.01 to 10 parts by weight of a photo-polymerizing initiator, wherein a total amount of the component (a), (b), (c), (d), and
(e) is 100 parts by weight.

4 Claims, No Drawings

FLAME-RESISTANT PHOTO-CURABLE RESIN COMPOSITION

BACKGROUND OF THE INVENTION

1. Field of the Invention

This invention refers to the composition of a flame-resistant photo-curable resin mixture, more specifically, a pattern-forming flame-resistant resin mixture that can be used as a solder resist (solder mask) in printed circuit board (referred to as "PC-board" below) manufacturing.

2. Prior Art

In the PC-board manufacturing industry, the solder resist (solder mask) is widely used as a permanent protective film on PC boards. Solder resist is used to prevent solder bridges that can form during soldering, and to prevent conductor corrosion and protect electric insulation during use. Since the solder resist must be able to withstand severe process and usage conditions, it must be capable of satisfying the following performance requirements:

Ability to maintain adhesion during immersion in solder (240°–280° C.)
Ability to maintain permanent adhesion
High resistance to solvents and other chemicals
Ability to maintain high electric insulation in a high-humidity environment
Flame resistance To satisfy these requirements, heat- or photo-curable inks have widely been used together with screen printing methods to form solder resists. In recent years, however, these printing methods have not kept pace with advances in circuit complexity and circuit element size reductions, and these methods have therefore become unsuitable for recent high-density printing method with regard to precision and fineness of detail. The screen printing method has reached a limit with regard to accuracy because further extension of the screen mesh can cause positional deviations and the ink may bleed or become blurred. On the other hand, if it is used to forcibly enhance the precision, the film may become too thin. Thus, screen printing is incapable of providing both the necessary thickness together with high precision.

Therefore, in recent years, the photo resist method is replacing the screen printing method. In the photo resist method, a photo-curable film is formed on the board and selectively exposed to light for curing. Following exposure, the non-cured portions are removed in a developing process. This method is far superior to the screen printing method, especially with respect to precision.

Several proposals have been made so far with regard to the formation of the photo-curable film used in the photo resist method. Japanese Patent Application, first publication No. (Tokukai Sho) 51-15733 proposes a method in which a photo-curable resin is applied to a printed circuit board in the form of a solution in an organic solvent, and then heat is applied to evaporate the solvent, leaving behind the photo-resist film. In this method, however, small through-holes not used for component mounting cannot be tented and the film on a pattern cannot be made thick enough.

It is preferable to apply a specific dry film resist proposed in Japanese Patent Application, first publication No. (Tokukai Sho) 54-1018 by heating under low pressure, as proposed in Japanese Patent Application, first publication No. (Tokukai Sho) 52-52703. However there is no dry film resist which can be developed with an alkaline developer and also finally cured product has necessary properties as a solder resist such as high adhesion, surface hardness, heat resistance and flame resistance.

The aim of the present invention is to provide a photo-curable resin composition for solder resist that can be developed by an alkaline developer in the pattern forming process and that has excellent flame resistance and other characteristics.

SUMMARY OF THE INVENTION

The inventors carefully investigated to achieve the above mentioned aim. As a result, it is found that the aim can be achieved by applying a specific bromine-substituted monomer to a system that is composed of an acrylic thermoplastic polymer containing a carboxyl group, a vinyl monomer, and a photo-polymerizing initiator, and thus we arrived to the present invention.

More specifically, the invention consists of:

(a) 35 to 65% by weight of an acrylic thermoplastic polymer copolymerized with 15 to 30% by weight of at least one type of monomer containing one or more alpha, beta-unsaturated carboxyl group; and (b) 5 to 30% by weight of a bromine-substituted monomer represented by general formula [I],

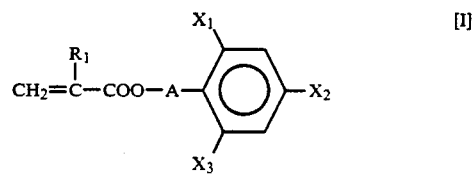

wherein,
$R_1$ represents H or $CH_3$ and
A represents

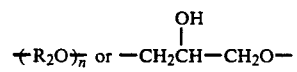

wherein $R_2$ is an alkylene group containing two or three carbon atoms, and n is an integer between 1 to 4; and $X_1$, $X_2$, and $X_3$ are Br or H, under the condition that at least two of the three are Br.

(c) 0 to 10% by weight of antimony trioxide particle with an average diameter of 0.1 μm or smaller, (d) 20 to 55% by weight of a vinyl monomer, excluding (b); and, (e) 0.01 to 10% by weight of a photo-polymerizing initiator.

(a), (b), (c), (d), and (e) are combined so that the total of their weight ratios equals 100%.

The flame-resistant photo-curable resin composition set forth in this disclosure based on this invention satisfies all the requirements for a good solder resist such as high adhesion, surface hardness, heat resistance, and flame resistance. Therefore, this flame-resistant photo-curable resin composition is useful as solder resist.

DETAILED DESCRIPTION OF THE PREFERRED EMBODIMENTS

Details of the invention are explained in detail in the following together with descriptions of the actions of each component.

The flame-resistant, photo-curable, resinous mixture that constitutes the invention is composed of the five general components listed above. The first one, (a), is an acrylic thermoplastic polymer. In order to enable image development with a dilute, aqueous alkaline solution such as sodium carbonate aqueous solution, (a) must contain a monomer with an alpha, beta-unsaturated carboxyl group as the first polymerizing substance which is copolymerized at a weight ratio of 15 to 30% with the other polymerizing compounds.

If the proportion of the monomer unit containing the alpha, beta-unsaturated carboxyl group accounts for less than 15% of the acrylic thermoplastic polymer by weight, the pattern cannot be developed by an alkaline developer. On the other hand, if the weight percentage is greater than 30%, the cured solder resist will have a large water absorption coefficient and, this may greatly lower the electrical insulating property under conditions of high humidity.

Practical examples of the above monomer unit containing an alpha, beta- unsaturated carboxyl group are: acrylic acid, methacrylic acid, cinnamic acid, crotonic acid, sorbic acid, itaconic acid, propiolic acid, maleic acid, and fumaric acid. It is also possible to use semi-esters and anhydrides of these compounds. The most favorable among these compounds are acrylic and methacrylic acids.

To enhance the properties of the solder resist, it is desirable that acrylic thermoplastic polymer (a) be composed of the following compounds and proportions:

the first polymerizing component, 15 to 30% by weight, composed of one or more types of monomer containing an alpha, beta-unsaturated carboxyl group the second polymerizing component, 2 to 25% by weight, composed of one or more types of the compound represented by the general formula [II] or its ring-substituted derivatives,

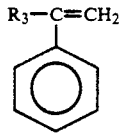

[II]

$R_3$—C=CH$_2$ ($R_3$ is a hydrogen atom or an alkyl group containing a one to six carbon atoms.)

the third polymerizing component, 10 to 40% by weight, composed of one or more types of alkyl acrylate compound(s) whose alkyl group contains one to eight carbon atoms, and the fourth polymerizing compound, 30 to 65% by weight, composed of one or more types of alkyl methacrylate compound(s) whose alkyl group contains one to eight carbon atoms.

The second polymerizing component in the above formulation is used to enhance the solvent resistance of the cured solder resist and its electric insulation even in a high-humidity environment. If this copolymerized component is less than 2% by weight, the cured solder resist will not have sufficient solvent resistance or electric insulation ability in a high-humidity environment. On the contrary if the copolymerized component's content is greater than 25% by weight, extended time is needed in order to develop the pattern using an alkaline developer.

Any of the well-known compounds indicated by the general formula [II] or their ring-substitution derivatives can be used, but styrene is the most preferable.

The third polymerizing component, an acrylate compound, is used to confer the appropriate amount of flexibility to the photo-cured resin in this invention. If the acrylate component constitutes less than 10% of the thermoplastic polymer by weight, the dry film resist will not have enough flexibility and will not adhere to the base material firmly, or the resist resin will not fit into the uneven surface of the base material. If the copolymerizer content of the third polymerizing substance is greater than 40% by weight, the resist resin becomes too soft. When the resulting dry-film resist is rolled up for storage, the resist resin may ooze out over time what is known as a cold-flow phenomenon. Furthermore, the solvent resistant of the cured solder resist is lowered.

Examples of suitable acrylate compounds are: methyl acrylate, ethyl acrylate, n-propyl acrylate, iso-propyl acrylate, n-butyl acrylate, sec-butyl acrylate, t-butyl acrylate, and 2-ethyl hexyl acrylate. The most favorable compounds are methyl acrylate, ethyl acrylate, n-butyl acrylate, and 2-ethyl hexyl acrylate.

The fourth polymerizing component is used because it couples with the alkyl acrylate, giving the appropriate flexibility to the acrylic thermoplastic polymer. Examples of this type of compound are: methyl methacrylate, ethyl methacrylate, n-propyl methacrylate, iso-propyl methacrylate, n-butyl methacrylate, secbutyl methacrylate, t-butyl methacrylate, and 2-ethyl hexyl methacrylate. The most favorable compound is methyl methacrylate.

In this invention, acrylic thermoplastic polymer (a) accounts for 35 to 65 parts by weight based on total of (a), (b), (c), (d) and (e) being 100 parts by weight. If the flame-resistant photo-curable resin composition contains less than 35 parts by weight of the acrylic thermoplastic polymer, the film formation property of the photosensitive layer will be impaired, making it prone to cold-flow problems. It also lowers the film's adhesiveness when heated. If the thermoplastic polymer content is greater than 65 parts by weight, the resist does not fit into the unevenness in the base material's surface and the solvent resistance decreases.

Component (b) of the flame-resistant photo-curable resin composition which comprises this invention is a bromine-substituted monomer with the specific structure shown in the general formula [I].

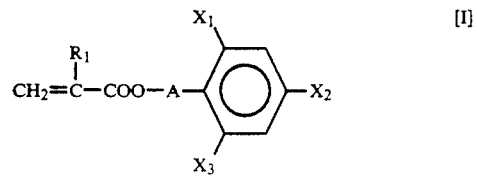

[I]

wherein, $R_1$ is H or $CH_3$ and

A is

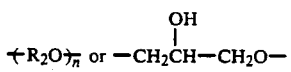

wherein $R_2$ is an alkylene group containing two or three carbon atoms and
n is an integer between 1 and 4; and
$X_1$, $X_2$, and $X_3$ are Br or H, under the condition that at least two of the three are Br.

Based on our careful research into the flame resistance of the photo-curable resin used for the solder resist, we think that a bromine-substituted monomer of the specific structure represented by the general formula [I] should be used as a flame retardant in order to let the solder resist a flame retardancy without sacrificing other properties.

If decabromobiphenyl ether, a flame retardant used widely in plastics, is added to the other components of this invention, for example, and formed into a thin photosensitive layer on a copper substrate, even spray washing of the unexposed resist with a 1% aqueous solution of sodium carbonate will leave behind traces of decabromobiphenyl ether adhering to the copper surface. If tetra-bromobisphenol A, another flame retardant widely used in plastics, is used together with the other components of this invention, the cured film will peel off when dipped into solder at 260° C. It is thought that this is due to the presence of free tetrabromobisphenol A in the cured film. When heated at 260° C., this tetrabromobisphenol A oozes out onto the copper surface and lowers the adhesive strength.

There are various acrylate and methacrylate compounds that have bromine-substituted groups, but if they do not have the configuration given by the general formula [I], they will have problems with respect to uniform solubility, heat-resistant adhesion, and solvent resistance. For example, tetrabromobisphenol A, di(meth)acrylate, tetrabromobisphenol A bis[ethoxy (meth)acrylate], or 2,4,6-tribromophenyl (meth)acrylate cannot be solved with other components uniformly. If 2,4,6-tribromophenoxy pentaethoxyacrylate is used, the solvent resistance decreases.

Some typical examples of compounds with the structure given in general formula [I] that are useful in this invention include:

*2,4,6-tribromophenoxyethyl (meth)acrylate

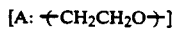

*2,4,6-tribromophenoxyethoxyethyl (meth)acrylate

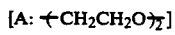

*2,4,6-tribromophenoxytetraethoxy (meth)acrylate

*2,4,6-tribromophenoxypropyl (meth)acrylate

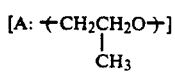

*3(2,4,6-tribromo)phenoxy 2-hydroxypropyl (meth)acrylate

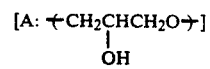

Judging from the flame resistance and the performance of the cured film, the bromine-substituted monomer in general formula [I] should be 5 to 30 parts by weight when (a), (b), (c), (d), and (e) total 100 parts by weight. If the bromine-substituted monomer in general formula [I] is less than 5 parts by weight, it is difficult to achieve sufficient flame resistance. If the bromine-substituted monomer in the general formula [I] is more than 30 parts by weight, the cured resin composition does no exhibit good adhesion to the base material or the heat resistance decreases.

The flame resistance of the solder resist can be further improved by using antimony trioxide with an average particle size of 0.1 µm or smaller together with a bromine-substituted monomer having the specific structure represented by the general formula [I].

Antimony trioxide enhances the flame resistance synergetically with halogen-containing molecules. The inventors exhaustively examined the use of antimony trioxide of various particle diameters and found that by using antimony trioxide with an average particle size of 0.1 µm or smaller, higher flame resistance can be achieved without adversely affecting the photosensitivity of the resin.

It was found that antimony trioxide with an average particle size greater than 0.1 µm precipitates out faster, resulting in a non-uniform composition. Moreover, pattern resolution is degraded and the effect of improving is insufficient.

Judging from the flame resistance and other performance factors, it is desirable that the ratio of antimony trioxide particles 0.1 µm or smaller be 0.1 to 10 parts by weight.

Using less than 0.1 parts by weight of antimony trioxide produces no noticeable gain in effectiveness. If the antimony trioxide content is greater than 10 parts by weight, the optical sensitivity and image resolution are degraded.

The flame-resistant photo-curable resin composition of the present invention contains a vinyl monomer, excluding component (b), 20 to 55 parts by weight as component (d). Component (d) solves the aforementioned acrylic thermoplastic polymer, and polymerizes to form bridge polymers when irradiated by activating light. It also improves the solvent resistance and electrical insulating capabilities of the cured solder resist.

Therefore, it is desirable that component (d) is a mixture of one or more types of vinyl monomer having plural polymerizable unsaturated bonds and one or more types of monofunctional vinyl monomers. Thus, the vinyl monomer of component (d) should contain 1.3 or more ethylene unsaturated bonds per monomeric molecule on average for best results.

In this invention, as polyfunctional vinyl monomers having multiple polymerizable unsaturated bonds, compounds plural (meth)acrylic groups are preferable. Suitable examples of polyfunctional vinyl monomers are poly(meth)acrylates of polyalcohols, such as polyethylene glycol di(meth)acrylate, polypropylene glycol di(meth)acrylate, 1,3-butanediol di-(meth)acrylate, 1,6-hexanediol di(meth)acrylate, neopentyl glycol di(meth)acrylate, 2,2-bis[4-(meth)acryloyloxy polyethoxy phenyl] propane $(CH_3)_2C$ [Ph-O(CH$_2$CH$_2$O)n-

COCR=CH₂]₂ where Ph=p-phenylene and R=H or CH₃), acryloyloxy pivalyl acryloyloxy pivalate,

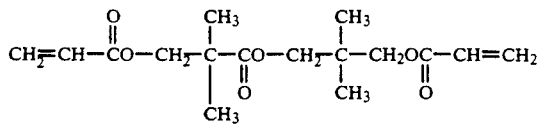

glycerin di(meth)acrylate, glycerin tri(meth)acrylate, trimethyrol ethane di(meth)acrylate, trimethyrol ethane tri(meth)acrylate, trimethyrol propane di(meth)acrylate, trimethyrol propane tri(meth)acrylate, trimethyrol propane tris[(meth)acryloyloxyethyl ether] (CH₃CH₂C (CH₂OCH₂CH₂OCOCR=CH₂)₃, where R=H or CH₃), trimethyrol propane tris[(meth)acryloyloxypropyl ether] (CH₃CH₂C (CH₂OCH₂CH₂CH(CH₃)OCOCR=CH₂)₃, where R=H or CH₃), trimethyrol propane tris[(meth)acryloyloxypolyethoxyethyl ether] (CH₃CH₂C [CH₂O (CH₂CH₂O)nCOCR=CH₂]₃, where R=H or CH₃), trimethylol propane tris[(meth)acryloyloxypolypropoxypropyl ether] (CH₃CH₂C [CH₂O (CH₂CH(CH₃)O)nCOCR=CH₂]₃, where R=H or CH₃), isocyanuric triethyrol di(meth)acrylate, isocyanuric triethyrol tri(meth)acrylate, pentaerythritol di(meth)acrylate, pentaerythritol tri(meth)acrylate, pentaerythritol tetra(meth)acrylate, dipentaerythritol tri(meth)acrylate, dipentaerythritol tetra(meth)acrylate, dipentaerythritol penta(meth)acrylate, dipentaerythritol hexa(meth)acrylate, epoxy (meth)acrylates and urethane (meth)acrylate. They can be used independently or in a mixed form.

As a monofunctional vinyl monomer, any monofunctional vinyl monomer other than component (b) can be used, but monofunctional (meth)acrylic esters without substituted with halogen atoms, and N-substituted (meth)acrylamides are preferably used.

Suitable examples of such monofunctional vinyl monomers are phenoxy ethyl (meth)acrylate, phenoxyethoxyethyl (meth)acrylate, 3-phenoxy-2-hydroxypropyl (meth)acrylate, methoxy diethoxy ethyl (meth)acrylate (CH₃O(CH₂CH₂O)₃COCR=CH₂ wherein R=H or CH₃) and alkoxymethyl (meth)acrylamides wherein alkyl of alkoxy group is alkyl or cycloalkyl group with not more than eight carbon atoms.

In this invention, bridge-forming vinyl monomer component (d) accounts for 20 to 55 parts by weight based on total of (a), (b), (c), (d) and (e) being 100 parts by weight. If the resin contains less than 20 parts by weight of the vinyl monomer component (d) by weight, the solvent resistance of cured resist decreases. If the vinyl monomer component (d) exceeds 55 parts by weight, the dry film will be subject to cold-flow problems and cured resist will have poor adhesiveness to the substrate when heated.

To optimize the characteristics of this flame-resistant, photo-curable resinous mixture in its use as a solder resist, vinyl monomer component (d) preferably contains an alkoxymethyl (meth)acrylamide compound represented by the general formula [III] at a weight ratio of 20 to 80%.

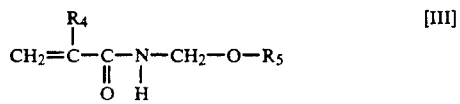

wherein R₄ is H or CH₃, and R₅ is an alkyl or cycloalkyl group with eight or fewer carbon atoms.

When this alkoxymethyl(meth)acrylamide [III] is used together with a binder thermoplastic polymer containing the styrene monomer unit described earlier (the second polymerizing compound), it has proven to enhance adhesiveness under heat and electrical insulation ability under conditions of high temperature and humidity.

It is desirable that alkoxy-methyl (meth)acrylamide monomer should account for 20 to 80% of the vinyl monomer by weight. If the percentage by weight is less than 20%, the above effect cannot be produced sufficiently. If the percentage of this component is greater than 80%, the solvent resistance of the cured resin composition decreases.

Some typical examples of alkoxymethyl(meth)acrylamide compounds with the structure given in the general formula [III] that are useful in this invention include:
methoxymethyl (meth)acrylamide
ethoxymethyl (meth)acrylamide
n-propoxymethyl (meth)acrylamide
iso-propoxymethyl (meth)acrylamide
n-butoxymethyl (meth)acrylamide
i-butoxymethyl (meth)acrylamide
t-butoxymethyl (meth)acrylamide
n-hexyloxymethyl (meth)acrylamide
2-ethylhexyloxymethyl (meth)acrylamide To enhance the solvent resistance of cured solder resist, it is desirable that the vinyl monomer should contain, on average, 1.3 or more ethylene unsaturated groups per molecule.

The flame-resistant, photo-curable resin composition that constitutes this invention contains a photo-polymerizing initiator as component (e). Photo-polymerizing initiator (e) can be one of the known benzophenones, Michler's ketone, 4,4'-bis(diethylamino) benzophenone, t-butylanthraquinone, 2-ethylanthraquinone, thioxanthones, benzoinalkyl ethers, or benzylketals. One or more of these can be used as an initiator.

The photo-polymerizing initiator used for this invention accounts for 0.1 to 10 parts by weight of the photo-curable resin based on total of (a), (b), (c), (d), and (e) being 100 parts by weight. If the content is less than 0.1 parts by weight, the composition does not cure fully under light. If the weight ratio content is greater than 10 parts by weight, the composition becomes thermally unstable.

To enhance adhesion to a metal surface, the flame-resistant photo-curable reson composition may contain tetrazol or one its derivatives. A small amount of tetrazol or its derivatives enhances the adhesion to a metal surface. 1-phenyl tetrazol, 5-phenyl tetrazol, 5-amino tetrazol, 5-amino-1-methyl tetrazol, 5-amino-2-methyl tetrazol, 5-mercapto-1-phenyl tetrazol, and 5-mercapto-1-methyl tetrazol can be used. One or more of these can be used together. The desirable content of tetrazol or its derivative ranges from 0.005 to 5 parts by weight of the total weight of (a), (b), (c), (d), and (e). If the content is less than 0.005 parts by weight, adhesion is not significantly enhanced. If the content is greater than 5 parts by weight, excessive time is needed to solve the tetrazol or its derivatives in the flame-resistant photo-curable resin composition and the photo sensitivity decreases. In addition to the above tetrazols, benzotriazol and benzimidazol can also be used.

A radical inhibitor, coloring agents, plasticizers, and fillers can also be added to the flame-resistant photo-curable resin composition if necessary.

Forming method of solder resist by using the flame-resistant photo-curable resin composition based on this invention is described as follows:

Firstly, a photosensitive layer composed of flame-resistant photo-curable resin of a specific composition is formed on the target substrate. The layer can be formed in two different ways:

1. By applying the photo-curable resin composition as a solution in an organic solvent and evaporating the solvent.
2. Peeling one film from a dry film resist made by sandwiching the photo-curable resin composition between two films and pressing the resin composition on the substrate and heating it.

As mentioned in the section on "Prior Art" the dry film resist method is preferable from the industrial processing viewpoint. To enhance the fitting to an uneven surface because of a wiring pattern, the dry film resist should be laminated thermally in a decompressed environment.

Secondly, the photosensitive layer is exposed to light to form a pattern. The layer can be exposed by various known methods, such as using ultraviolet rays, visible light, and laser exposure methods. For selective exposure, the photomasking or direct imaging method is used.

Thirdly, the non-cured portions (non-exposed portions) can be removed using an alkaline developer. The alkaline developer may be an aqueous solution of sodium carbonate, sodium phosphate, or potassium carbonate. A small amount of antifoaming or surface active agent can be added to these aqueous solutions. The spray method is used most commonly, but the dipping method can be used as a substitute process. The cured film can be processed by active light and/or heat application after alkaline development in order to perfect the curing.

EXAMPLES

This invention is explained in detail by providing examples and comparisons below.

Fabricating Alkaline-Developing Dry Film Resist

The acrylic thermoplastic polymer, bromine-substituted monomer, antimony trioxides, vinyl monomers, photo-polymerizing initiators, and other components listed in Tables 1 and 2 were added to a mixed solvent of 50 parts by weight of isopropyl alcohol and 100 parts by weight of methyl-ethyl ketone, then fully stirred until dissolved into a solution. Table 3 lists the composition of the acrylic thermoplastic polymers (parts by weight) in Tables 1 and 2.

TABLE 1

Composition of examples

| | Example No. | | | |
|---|---|---|---|---|
| | 1 | 2 | 3 | 4 |
| Acrylic thermo plastic polymer | | | | |
| Item No. | P1 | P1 | P1 | P1 |
| Parts by weight | 50 | 40 | 45 | 37 |
| Bromine-substituted monomer | | | | |
| Parts by weight | | | | |
| 2,4,6-tribromophenoxyethyl acrylate | 5.5 | 28 | 5.5 | 28 |
| 2,4,6-tribromophenoxyethyl methacrylate | | | | |
| 2,4,6-tribromophenoxyethoxyethyl acrylate | | | | |
| 2,4,6-tribromophenoxy tetraethoxy acrylate* | | | | |
| 2,4,6-tribromophenoxypropyl acrylate | | | | |
| 3(2,4,6-tribromo)phenoxy 2-hydroxypropyl acrylate | | | | |
| Antimony trioxide | | | | |
| Average particle diameter (μm) | 0.02 | 0.02 | 0.02 | 0.02 |
| Parts by weight | 0.15 | 0.15 | 8.0 | 8.0 |
| Vinyl monomer | | | | |
| Parts by weight | | | | |
| n-butoxylmethyl acrylamide | 15 | 12 | 15 | 11 |
| n-butoxymethyl metharylamide | | | | |
| methoxymethyl acrylamide | | | | |
| acryloyloxy pivalyl | | | | |
| acryloyloxy pivalate | | | | |
| trimethylol propane tris(acryloyloxyethyl ether) | 25.35 | 15.85 | 22.5 | 12 |
| trimethyl propane triacrylate | | | | |
| Photo-polymerizing initiator | | | | |
| Parts by weight | | | | |
| benzophenone | 3.8 | 3.8 | 3.8 | 3.8 |
| Michler's ketone | 0.2 | 0.2 | 0.2 | 0.2 |
| Other | | | | |
| Parts by weight | | | | |
| chlorine copper phthalocyanine | 0.2 | 0.2 | 0.2 | 0.2 |
| hydroquinone monomethyl ether | 0.05 | 0.05 | 0.05 | 0.05 |
| 5-amino 1H tetrazol | 0.5 | 0.5 | 0.5 | 0.5 |

| | Example No. | | |
|---|---|---|---|
| | 5 | 6 | 7 |
| Acrylic thermo plastic polymer | | | |
| Item No. | P1 | P1 | P2 |
| Parts by weight | 45 | 45 | 45 |
| Bromine-substituted monomer | | | |
| Parts by weight | | | |
| 2,4,6-tribromophenoxyethyl acrylate | 15 | 15 | |
| 2,4,6-tribromophenoxyethyl methacrylate | | | 15 |
| 2,4,6-tribromophenoxyethoxyethyl acrylate | | | |
| 2,4,6-tribromophenoxy tetraethoxy acrylate* | | | |
| 2,4,6-tribromophenoxypropyl acrylate | | | |
| 3(2,4,6-tribromo)phenoxy 2-hydroxypropyl acrylate | | | |
| Antimony trioxide | | | |
| Average particle diameter (μm) | 0.02 | 0.02 | 0.02 |
| Parts by weight | 1.0 | 1.0 | 1.0 |
| Vinyl monomer | | | |
| Parts by weight | | | |
| n-butoxylmethyl acrylamide | 12 | | |
| n-butoxymethyl metharylamide | | 8 | |
| methoxymethyl acrylamide | | | 20 |
| acryloyloxy pivalyl | | 27 | |
| acryloyloxy pivalate | | | |
| trimethylol propane tris(acryloyloxyethyl ether) | 23 | | |
| trimethylol propane triacrylate | | | 15 |
| Photo-polymerizing initiator | | | |
| Parts by weight | | | |
| benzophenone | 3.8 | 3.8 | 3.8 |
| Michler's ketone | 0.2 | 0.2 | 0.2 |
| Other | | | |
| Parts by weight | | | |
| chlorine copper phthalocyanine | 0.2 | 0.2 | 0.2 |
| hydroquinone monomethyl ether | 0.05 | 0.05 | 0.05 |
| 5-amino 1H tetrazol | 0.5 | — | 0.5 |

| | Example No. | | |
|---|---|---|---|
| | 8 | 9 | 10 |
| Acrylic thermo plastic polymer | | | |
| Item No. | P3 | P4 | P1 |
| Parts by weight | 45 | 45 | 45 |
| Bromine-substituted monomer | | | |
| Parts by weight | | | |
| 2,4,6-tribromophenoxyethyl acrylate | | | |

TABLE 1-continued

Composition of examples

| | Example No. | | |
|---|---|---|---|
| | 11 | 12 | 13 |
| Acrylic thermo plastic polymer | | | |
| Item No. | P2 | P1 | P1 |
| Parts by weight | 45 | 58 | 36 |
| Bromine-substituted monomer | | | |
| Parts by weight | | | |
| 2,4,6-tribromophenoxyethyl acrylate | | 5.5 | 5.5 |
| 2,4,6-tribromophenoxyethyl methacrylate | | | |
| 2,4,6-tribromophenoxyethoxyethyl acrylate | 15 | | |
| 2,4,6-tribromophenoxy tetraethoxy acrylate* | | 15 | |
| 2,4,6-tribromophenoxypropyl acrylate | | | 15 |
| 3(2,4,6-tribromo)phenoxy 2-hydroxypropyl acrylate | | | |
| Antimony trioxide | | | |
| Average particle diameter (μm) | 0.02 | 0.02 | 0.02 |
| Parts by weight | 1.0 | 1.0 | 1.0 |
| Vinyl monomer | | | |
| Parts by weight | | | |
| n-butoxylmethyl acrylamide | 12 | 12 | 12 |
| n-butoxymethyl metharylamide | | | |
| methoxymethyl acrylamide | | | |
| acryloyloxy pivalyl acryloyloxy pivalate | | | |
| trimethylol propane tris(acryloyloxyethyl ether) | 23 | 23 | 23 |
| trimethylol propane triacrylate | | | |
| Photo-polymerizing initiator | | | |
| Parts by weight | | | |
| benzophenone | 3.8 | 3.8 | 3.8 |
| Michler's ketone | 0.2 | 0.2 | 0.2 |
| Other | | | |
| Parts by weight | | | |
| chlorine copper phthalocyanine | 0.2 | 0.2 | 0.2 |
| hydroquinone monomethyl ether | 0.05 | 0.05 | 0.05 |
| 5-amino 1H tetrazol | 0.5 | 0.5 | 0.5 |

| | Example No. | | |
|---|---|---|---|
| | 14 | 15 | 16 |
| Acrylic thermo plastic polymer | | | |
| Item No. | P5 | P6 | P7 |
| Parts by weight | 45 | 45 | 45 |
| Bromine-substituted monomer | | | |
| Parts by weight | | | |
| 2,4,6-tribromophenoxyethyl acrylate | 15 | 15 | 15 |
| 2,4,6-tribromophenoxyethyl methacrylate | | | |
| 2,4,6-tribromophenoxyethoxyethyl acrylate | | | |
| 2,4,6-tribromophenoxy tetraethoxy acrylate* | | | |
| 2,4,6-tribromophenoxypropyl acrylate | | | |
| 3(2,4,6-tribromo)phenoxy 2-hydroxypropyl acrylate | | | |
| Antimony trioxide | | | |
| Average particle diameter (μm) | 0.02 | 0.02 | 0.02 |
| Parts by weight | 1.0 | 1.0 | 1.0 |
| Vinyl monomer | | | |
| Parts by weight | | | |
| n-butoxylmethyl acrylamide | 12 | 12 | 12 |
| n-butoxymethyl metharylamide | | | |
| methoxymethyl acrylamide | | | |
| acryloyloxy pivalyl acryloyloxy pivalate | | | |
| trimethylol propane tris(acryloyloxyethyl ether) | 23 | 23 | 23 |
| trimethylol propane triacrylate | | | |
| Photo-polymerizing initiator | | | |
| Parts by weight | | | |
| benzophenone | 3.8 | 3.8 | 3.8 |
| Michler's ketone | 0.2 | 0.2 | 0.2 |
| Other | | | |
| Parts by weight | | | |
| chlorine copper phthalocyanine | 0.2 | 0.2 | 0.2 |
| hydroquinone monomethyl ether | 0.05 | 0.05 | 0.05 |
| 5-amino 1H tetrazol | 0.5 | 0.5 | 0.5 |

| | Example No. | | |
|---|---|---|---|
| | 17 | 18 | 19 |
| Acrylic thermo plastic polymer | | | |
| Item No. | P8 | P1 | P1 |
| Parts by weight | 45 | 45 | 45 |
| Bromine-substituted monomer | | | |
| Parts by weight | | | |
| 2,4,6-tribromophenoxyethyl acrylate | 15 | 15 | 15 |
| 2,4,6-tribromophenoxyethyl methacrylate | | | |
| 2,4,6-tribromophenoxyethoxyethyl acrylate | | | |
| 2,4,6-tribromophenoxy tetraethoxy acrylate* | | | |
| 2,4,6-tribromophenoxypropyl acrylate | | | |
| 3(2,4,6-tribromo)phenoxy 2-hydroxypropyl acrylate | | | |
| Antimony trioxide | | | |
| Average particle diameter (μm) | 0.02 | 0.02 | 0.02 |
| Parts by weight | 1.0 | 1.0 | 1.0 |
| Vinyl monomer | | | |
| Parts by weight | | | |
| n-butoxylmethyl acrylamide | 12 | 5 | |
| n-butoxymethyl metharylamide | | | |
| methoxymethyl acrylamide | | | |
| acryloyloxy pivalyl acryloyloxy pivalate | | | 5 |
| trimethylol propane tris(acryloyloxyethyl ether) | 23 | 30 | 30 |
| trimethylol propane triacrylate | | | |
| Photo-polymerizing initiator | | | |
| Parts by weight | | | |
| benzophenone | 3.8 | 3.8 | 3.8 |
| Michler's ketone | 0.2 | 0.2 | 0.2 |
| Other | | | |
| Parts by weight | | | |
| chlorine copper phthalocyanine | 0.2 | 0.2 | 0.2 |
| hydroquinone monomethyl ether | 0.05 | 0.05 | 0.05 |
| 5-amino 1H tetrazol | 0.5 | 0.5 | 0.5 |

| | Example No. | | |
|---|---|---|---|
| | 20 | 21 | 22 |
| Acrylic thermo plastic polymer | | | |
| Item No. | P1 | P1 | P1 |
| Parts by weight | 45 | 45 | 45 |
| Bromine-substituted monomer | | | |
| Parts by weight | | | |

TABLE 1-continued

Composition of examples

| Parts by weight | | | |
|---|---|---|---|
| 2,4,6-tribromophenoxyethyl acrylate | 15 | 15 | 15 |
| 2,4,6-tribromophenoxyethyl methacrylate | | | |
| 2,4,6-tribromophenoxyethoxyethyl acrylate | | | |
| 2,4,6-tribromophenoxy tetraethoxy acrylate* | | | |
| 2,4,6-tribromophenoxypropyl acrylate | | | |
| 3(2,4,6-tribromo)phenoxy 2-hydroxypropyl acrylate | | | |
| Antimony trioxide | | | |
| 5-amino 1H tetrazol | 0.5 | 0.05 | 0.05 |

*: 2,4,6-tribromophenoxy tetraethoxy acrylate structure: Br-substituted phenyl ring (Br at 2,4,6 positions) — O(CH$_2$CH$_2$O)$_4$CCH=CH$_2$ with C=O

TABLE 2

Composition of reference examples

| Reference example No. | 1 | 2 | 3 | 4 | 5 | 6 | 7 | 8 | 9 | 10 | 11 | 12 | 13 |
|---|---|---|---|---|---|---|---|---|---|---|---|---|---|
| Acrylic thermoplastic polymer | | | | | | | | | | | | | |
| Item No. | P1 | P1 | P1 | P1 | P1 | P1 | P1 | P1 | P1 | P9 | P10 | P1 | P1 |
| Parts by weight | 50 | 37 | 49 | 37 | 45 | 45 | 45 | 45 | 45 | 45 | 45 | 62 | 32 |
| Bromine compound | | | | | | | | | | | | | |
| name | — | (a) | (a) | (a) | (a) | (b) | (c) | (d) | (e) | (a) | (a) | (a) | (a) |
| Parts by weight | 0 | 15 | 3 | 33 | 15 | 15 | 15 | 15 | 15 | 15 | 15 | 15 | 15 |
| Antimony trioxide | | | | | | | | | | | | | |
| Average particle diameter (μm) | — | 0.02 | 0.02 | 0.02 | 0.2 | 0.02 | 0.02 | 0.02 | 0.02 | 0.02 | 0.02 | 0.02 | 0.02 |
| Parts by weight | 0 | 13 | 1.0 | 1.0 | 1.0 | 1.0 | 1.0 | 1.0 | 1.0 | 1.0 | 1.0 | 1.0 | 1.0 |
| Vinyl monomer Parts by weight | | | | | | | | | | | | | |
| n-butoxymethyl acrylamide | 20 | 14 | 20 | 10 | 12 | 12 | 12 | 12 | 12 | 12 | 12 | 8 | 20 |
| trimethylolpropane tris-(acryloyloxyethyl ether) | 26 | 17 | 23 | 15 | 23 | 23 | 23 | 23 | 23 | 23 | 23 | 10 | 28 |
| Photo-polymerizing initiator Parts by weight | | | | | | | | | | | | | |
| benzophenone | 3.8 | 3.8 | 3.8 | 3.8 | 3.8 | 3.8 | 3.8 | 3.8 | 3.8 | 3.8 | 3.8 | 3.8 | 3.8 |
| Michler's ketone | 0.2 | 0.2 | 0.2 | 0.2 | 0.2 | 0.2 | 0.2 | 0.2 | 0.2 | 0.2 | 0.2 | 0.2 | 0.2 |
| Other Parts by weight | | | | | | | | | | | | | |
| chlorine copper phthalocyannine | 0.2 | 0.2 | 0.2 | 0.2 | 0.2 | 0.2 | 0.2 | 0.2 | 0.2 | 0.2 | 0.2 | 0.2 | 0.2 |
| hydroquinone monomethyl ether | 0.05 | 0.05 | 0.05 | 0.05 | 0.05 | 0.05 | 0.05 | 0.05 | 0.05 | 0.05 | 0.05 | 0.05 | 0.05 |
| 5-amino 1H tetrazol | 0.5 | 0.5 | 0.5 | 0.5 | 0.5 | 0.5 | 0.5 | 0.5 | 0.5 | 0.5 | 0.5 | 0.5 | 0.5 |

(a): 2,4,6-tribromophenoxy ethyl acrylate
(b): decabromobiphenyl ether
(c): tetrabromo bisphenol A
(d): tetrabromo bisphenol A bis(acryloyloxy ethyl ether)
(e): 2,4,6-tribromophenoxy pentaethoxy acrylate

| | | | |
|---|---|---|---|
| Average particle diameter (μm) | 0.02 | — | 0.02 |
| Parts by weight | 1.0 | 0 | 0.08 |
| Vinyl monomer Parts by weight | | | |
| n-butoxylmethyl acrylamide | 25 | 16 | 16 |
| n-butoxymethyl metharylamide | | | |
| methoxymethyl acrylamide | | | |
| acryloyloxy pivalyl | | | |
| acryloyloxy pivalate | | | |
| trimethylol propane tris(acryloyloxyethyl ether) | 10 | 20 | 19.92 |
| trimethylol propane triacrylate | | | |
| Photo-polymerizing initiator Parts by weight | | | |
| benzophenone | 3.8 | 3.8 | 3.8 |
| Michler's ketone | 0.2 | 0.2 | 0.2 |
| Other Parts by weight | | | |
| chlorine copper phthalocyanine | 0.2 | 0.2 | 0.2 |
| hydroquinone monomethyl ether | 0.05 | 0.05 | 0.05 |

TABLE 3

Composition of acrylic thermoplastic polymer

| * | P1 | P2 | P3 | P4 | P5 | P6 | P7 | P8 | P9 | P10 |
|---|---|---|---|---|---|---|---|---|---|---|
| methacrylic acid | 24 | 22 | 18 | 28 | 24 | 24 | 24 | 24 | 13 | 35 |
| styrene | 10 | 18 | 4 | 10 | 0 | 30 | 10 | 10 | 10 | 10 |
| methyl acrylate | 20 | | 35 | | 20 | 20 | 7 | 45 | 20 | 20 |
| n-butyl acrylate | | 15 | | | | | | | | |
| 2-ethyl hexyl acrylate | | | | 18 | | | | | | |
| methyl methacrylate | 46 | 45 | 43 | 44 | 56 | 26 | 59 | 21 | 57 | 35 |

*: monomer unit Parts by weight

The obtained composition is stored at room temperature for 24 hours and their being uniform mixture was confirmed. The composition was then degassed by storing statically in a decompressed environment for 8 hours and applied to a 25 μm-thick polyester layer so that a 75 μm-thick photosensitive layer could be formed after drying. The solvent was evaporated by passing it through a tunnel-type drying furnace (40° C.×3 m, 60° C.×3 m, 90° C.×6 m) at a rate of 1 m/min. A 30 μm-thick polyethylene film was superposed on the layer, the ends were slit, and the product was collected on a roll 300 mm wide and 120 m long.

EXAMPLES 1 TO 20 AND COMPARATIVE EXAMPLES 1 TO 17

The solder resist was formed by the following method, from the alkaline-developing dry film resist manufactured as explained above, and its performance was evaluated. Table 4 shows the evaluation results.

TABLE 4

Evaluation results

| Example No. | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|
| Photosensitive resin solution stability | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ |
| Cold flow | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ○ | ⊙ | ⊙ | ⊙ | ⊙ |
| Fitting | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ○ | ⊙ | ⊙ | ⊙ | ⊙ | ⊙ |
| Pencil hardness | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ |
| Adhesion | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ○ | ⊙ | ○ | ○ | ⊙ | ⊙ |
| Solder heat resistance | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ |
| Adhesion after solder heat resistance | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ○ | ⊙ | ○ | ○ | ⊙ | ⊙ |
| Solvent resistance | ⊙ | ⊙ | ⊙ | ⊙ | ⊙ | ⊙ | ⊙ | ⊙ | ⊙ | ⊙ | ⊙ | ⊙ | ⊙ | ⊙ | ○ | ⊙ | ⊙ | ○ | ⊙ | ○ | ⊙ | ⊙ |
| Electric insulation | ⊙ | ⊙ | ⊙ | ⊙ | ⊙ | ⊙ | ⊙ | ⊙ | ⊙ | ⊙ | ⊙ | ⊙ | ⊙ | ○ | ⊙ | ⊙ | ⊙ | ⊙ | ⊙ | ○ | ⊙ | ⊙ |
| Necessary development time | ⊙ | ⊙ | ⊙ | ⊙ | ⊙ | ⊙ | ⊙ | ⊙ | ⊙ | ⊙ | ⊙ | ⊙ | ⊙ | ⊙ | ○ | ⊙ | ⊙ | ⊙ | ⊙ | ⊙ | ⊙ | ⊙ |
| Flame resistance | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ○ | ○ |
| Line Resolution | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ |

| Reference Example No. | 1 | 2 | 3 | 4 | 5 | 6 | 7 | 8 | 9 | 10 | 11 | 12 | 13 |
|---|---|---|---|---|---|---|---|---|---|---|---|---|---|
| Photosensitive resin solution stability | ⊙ | ⊙ | ⊙ | ⊙ | X | ⊙ | ⊙ | X | ⊙ | ⊙ | ⊙ | ⊙ | ⊙ |
| Cold flow | ⊙ | ⊙ | ⊙ | ⊙ | ⊙ | ⊙ | ⊙ | ⊙ | ⊙ | ⊙ | ⊙ | ⊙ | X |
| Fitting | ⊙ | ⊙ | ⊙ | ⊙ | ⊙ | ⊙ | ⊙ | ⊙ | ⊙ | ⊙ | ⊙ | ○ | ⊙ |
| Pencil hardness | ⊙ | ⊙ | ⊙ | ⊙ | ⊙ | ⊙ | ⊙ | ⊙ | ⊙ | ⊙ | ⊙ | ⊙ | ⊙ |
| Adhesion | ⊙ | ⊙ | ⊙ | X | ○ | ⊙ | ⊙ | ○ | ⊙ | ⊙ | ⊙ | ⊙ | ○ |
| Solder heat resistance | ⊙ | ⊙ | ⊙ | X | ⊙ | ⊙ | X | ⊙ | ⊙ | ⊙ | ⊙ | X | ⊙ |
| Adhesion after solder heat resistance | ⊙ | ⊙ | ⊙ | X | ○ | ⊙ | ○ | ○ | ⊙ | ⊙ | ⊙ | ⊙ | ○ |
| Solvent resistance | ⊙ | ○ | ⊙ | ○ | ○ | ⊙ | ⊙ | ⊙ | X | ⊙ | X | X | ⊙ |
| Electric insulation | ⊙ | ⊙ | ⊙ | ○ | ⊙ | ⊙ | ⊙ | ⊙ | ○ | ⊙ | X | ⊙ | ⊙ |
| Necessary development time | ⊙ | ○ | ⊙ | ⊙ | ⊙ | X | ⊙ | X | ⊙ | X | ⊙ | ⊙ | ⊙ |
| Flame resistance | X | ⊙ | X | ⊙ | X | ⊙ | ⊙ | ⊙ | ⊙ | ⊙ | ⊙ | ⊙ | ⊙ |
| Line Resolution | ⊙ | X | ⊙ | ⊙ | ⊙ | ⊙ | ⊙ | X | ⊙ | X | ⊙ | ⊙ | ⊙ |

TEST PC BOARD

The following PC board was used to evaluate the solder resist performance.
Copper through-hole double-sided board
Base material: 1.6 mm glass fiber reinforced epoxy resin
Copper pattern height: 38 μm
Wiring density: Line width/space width is 120 μm/180 μm
Having a solid copper area of 5 cm×5 cm or greater in a part of surface.
Note: The board was polished by rolled buff, washed with water, and dried immediately before use.

FORMING PHOTO-CURING RESIN

1), 2), 3), 4), and 5) indicate the order of formation.

1) Laminate

The dry film resist was laminated on the above PC board by using a Hitachi Condenser vacuum laminator HLM-V-570 (Hitachi Condense Inc.) under the following conditions:
Board preheating roller temperature: 120° C.
Heat shoe temperature: 100° C.
Laminating air pressure (cylinder pressure): 5 kgf/cm$^2$
Atomosperic pressure in the vacuum chamber: 10 mmHg
Laminating speed: 0.8 m/min

2) Exposure

A solder resist photomask was superposed on each side of the board laminated with dry film resist. The board was then exposed under light using Hitec's DFR exposer HTE-106. The exposure time was equal to the exposure time of the 15th step remained with Mitsubishi Rayon's 25 step tablet.

3) Development

The cover film was peeled from the exposed board which was then sprayed with a 30° C. aqueous solution of 1% sodium carbonate for development by using a conveyor type developer. Table 4 shows the minimum development time needed to completely remove the non-exposed portions. The development time was set to 1.5 times the minimum value for the subsequent processing and evaluation.

4) Water Cleaning and Drying

Room-temperature water was sprayed over the developed board for 1 minute and any remaining water was removed from the board by an air knife. The board was then dried for 5 minutes at 70° C.

5) Post-Curing

The resist was then irradiated three times with ultraviolet radiation at an intensity of 1J/cm$^2$ using a high-pressure mercury lamp. After irradiation, the resist was heated at 150° C. for one hour.

EVALUATION

Stability of Photosensitive Resin Solution

As described in the section on "Manufacturing alkaline-developing dry film resist," solution uniformity was checked visually after 24-hour storage at room temperature.
⊙: Uniform solution
X: Sediment at the bottom of the container

Cold-Flow Characteristic

A roll of dry film resist, 300 mm wide and 120 m long, was stored in a dark place at 25° C. and 60% RH and checked visually for resin oozing (cold-flow) from the film edges after two and five days.
⊙: No cold-flow was observed after five days ○: No cold-flow after two days but slight cold-flow after five days
X: Cold flow after two days

Material After Curing

Fitting

After solder resist was applied to the board, the board was observed using a stereoscopic microscope to check for air trapping between the solder resist and board.
⊙: No air trapping
○: Slight air trapping but no problem
X: Serious air trapping and unusable

Pencil Hardness Measurement

Pencil hardness measurements were made using the method prescribed in section 6.14 of JIS K5400.
⊙: 4H or more
X: Less than 4H

Adhesion

The solder resist formed on copper was 2 mm square cross-sectioned (10×10=100 pieces) using a cutter knife. A piece of adhesive tape was firmly adhered to the surface. One end of the tape was held vertical to the board surface and pulled quickly to determine how much solder resist would remain.
⊙: 90% or more remaining
○: 80% (inclusive) to 90% (exclusive) remaining
X: Less than 80% remaining

Heat Resistance of Solder

A board coated with solder resist was floated on 260° C. eutectic-point composition solder for 10 seconds and the solder resist was checked for blistering or peeling.
⊙: Neither blistering nor peeling
X: Blistering or peeling

Adhesion After Solder Processing

Board processed in solder, as described above, were checked for adhesion strength in the same way.
⊙: 90% or more remaining
○: 80% (inclusive) to 90% (exclusive) remaining
X: Less than 80% remaining

Solvent Resistance

A board having solder resist was immersed in methylene chloride at the room temperature and checked for blistering or peeling of solder resist.
⊙: Neither blistering nor peeling after five-minute immersion
○: Blistering or peeling after five-minute immersion but neither blistering nor peeling after two-minute immersion
X: Blistering or peeling after two-minute immersion

Electric Insulation in a High-Humidity Environment

Solder resist was formed into the IPC-B-25 multi-purpose test pattern prescribed in IPC-SM840A and wires were connected in comb pattern B. A 100V DC current was applied for seven days under the Class 3 conditions and the electric insulation characteristics were measured using an insulation resistance meter.

Class 3 Conditions 8-hour cycles at 90% RH throughout the test period
Temperature raised from 25° C. to 65° C. within 1 hour and 45 minutes
Temperature maintained at 65° for 4 hours and 30 minutes
Temperature lowered from 65° C. to 25° C. within 1 hour and 45 minutes
⊙: $5 \times 10^8 \Omega$ or more
○: $5 \times 10^7$ to $5 \times 10^8 \Omega$ (exclusive)
X: Less than $5 \times 10^7 \Omega$

Necessary Development Time

The time needed for development was calculated from the number of seconds spent in the aforementioned development process using an alkaline developer.
⊙: Less than 120 seconds
○: 120 to 180 seconds
X: more then 180 seconds

Evaluation of Flame Resistance 0.8 mm-thick and 1.6 mm-thick glass fiber reinforced epoxy resin copper-clad laminates [Sumilite ELC-4756 of Sumitomo Bakelite Inc.] were etched by using an aqueous solution of ferric chloride to remove the copper foil from both board faces. Then, a 75 μm-thick cured film was formed on both faces of each etched board as explained before. Next, then 127×12.7 mm pieces were cut off from the film-coated board for a flame resistance test. Five of them were stored at 23° C. and 50% RH for at least 48 hours. The other five were thermally treated at 125° C. for 24 hours and cooled in a desiccator containing anhydrous calcium chloride for 4-5 hours. The flame resistance characteristics of these test pieces were evaluated according to the flame resistance test method (UL-94V-0) of Underwriters Laboratories, Inc.
⊙: Both the 1.6 mm- and 0.8 mm-thick laminates passed the UL94V-0 test.
○: The 1.6 mm-thick laminate passed the UL94V-0 test but the 0.8 mm-thick laminate did not.
X: Both the 1.6 mm- and 0.8 mm-thick laminates failed the UL94V-0 test.

Line Resolution

The board was irradiated with light by superposing a pattern 125 μm/125 μm (line/space) and the spaces were observed for development using a magnifying glass.
⊙: Developed
X: Not developed As Table 4 shows that the final product of the photocurable resin composition based on this invention satisfied all the performance requirements as a solder resist which are adhesion, surface hardness, heat resistance, and flame resistance.

What is claimed:
1. A flame-resistant, photo-curable resin composition in the form of dry film resists, consisting essentially of:
(a) 35 to 65 parts by weight of an acrylic thermoplastic polymer, the acrylic thermoplastic polymer being prepared from a monomer combination consisting essentially of:
(i) 15 to 30% by weight of a first polymerizing component consisting of at least one α,β-unsaturated carboxyl group containing monomer;
(ii) 2 to 25% by weight of a second polymerizing component which is a member selected from the group consisting of a compound of the formula (II):

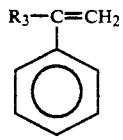

where in $R_3$ is hydrogen or $C_{1\text{-}6}$-alkyl and wherein hydrogen atoms of the phenyl group may be optionally substituted by functional groups;

(iii) 10 to 40% by weight of a third polymerizing component which is at least one alkyl acrylate, wherein the alkyl group has 1 to 8 carbon atoms; and (iv) 30 to 65% by weight of a fourth polymerizing component which is at least one alkyl methacrylate whose alkyl group has 1 to 8 carbon atoms;

(b) 5 to 30 parts by weight of a bromine-substituted monomer of formula (I):

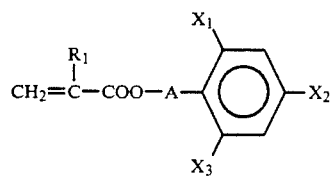

wherein $R_1$ is hydrogen of methyl, A is $-(R_2O)_n-$ or

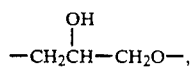

wherein $R_2$ is an alkylene group containing 2 or 3 carbon atoms, and n is an integer of 1 to 4, and $X_1$, $X_2$ and $X_3$ are Br or hydrogen, under the condition that at least two of $X_1$, $X_2$ and $X_3$ are Br;

(c) 20 to 50 parts by weight of a vinyl monomer other than a monomer of formula (I), wherein vinyl monomer (c) is a mixture of at least one polyfunctional (meth)acrylate having plural unsaturated polymerizable bonds and at least one monofunctional vinyl monomer having one unsaturated polymerizable bond, the vinyl monomer (c) having at least 1.3 ethylenically unsaturated bonds per vinyl monomer molecule on the average, wherein the monofunctional vinyl monomer is an alkoxymethyl (meth)acrylate of the formula (III):

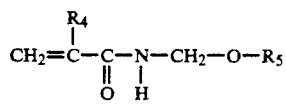

wherein $R_4$ is hydrogen or methyl, and $R_5$ is an alkyl group having 8 or less carbon atoms or a cycloalkyl group having 8 or less carbon atoms, the content of alkoxymethyl (meth)acrylamide of formula (III) being 20 to 80% by weight of vinyl monomer (c); and (d) 0.01 to 10 parts by weight of a photo-polymerizing initiator, wherein the total amount of components (a), (b), (c) and (d) is 100 parts by weight.

2. A flame-resistant photo-curing resin composition recited in claim 1, wherein the acrylic thermoplastic polymer consists essentially of:
- 15 to 30% by weight of methacrylic acid,
- 2 to 25% by weight of styrene,
- 10 to 40% by weight of alkyl acrylate with an alkyl group having 1 to 8 carbon atoms, and
- 30 to 65% by weight of methyl methacrylate.

3. A flame-resistant, photo-curable resin composition in the form of dry film resists, consisting essentially of:

(a) 35 to 65 parts by weight of an acrylic thermoplastic polymer, the acrylic thermoplastic polymer being prepared from a monomer combination consisting essentially of:

(i) 15 to 30% by weight of a first polymerizing component consisting of at least one $\alpha,\beta$-unsaturated carboxyl group containing monomer;

(ii) 2 to 25% by weight of a second polymerizing component which is a member selected from the group consisting of a compound of the formula (II):

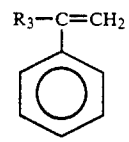

wherein $R_3$ is hydrogen or $C_{1\text{-}6}$-alkyl and wherein hydrogen atoms of the phenyl group may be optionally substituted by functional groups;

(iii) 10 to 40% by weight of a third polymerizing component which is at least one alkyl acrylate, wherein the alkyl group has 1 to 8 carbon atoms; and (iv) 30 to 65% by weight of a fourth polymerizing component which is at least one alkyl methacrylate whose alkyl group has 1 to 8 carbon atoms;

(b) 5 to 30 parts by weight of a bromine-substituted monomer of formula (I):

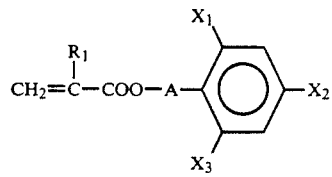

wherein $R_1$ is hydrogen or methyl, A is $-(R_2O)_n-$ or

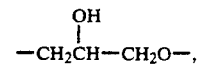

wherein $R_2$ is an alkylene group containing 2 to 3 carbon atoms, and n is an integer of 1 to 4, and $X_1$, $X_2$ and $X_3$ are Br or hydrogen, under the condition that at least two of $X_1$, $X_2$ and $X_3$ are Br;

(c) 20 to 50 parts by weight of a vinyl monomer other than a monomer of formula (I), wherein vinyl monomer (c) is a mixture of at least one polyfunctional (meth)acrylate having plural unsaturated polymerizable bonds and at least one monofunctional vinyl monomer having one unsaturated polymerizable bond, the vinyl monomer (c) having at least 1.3 ethylenically unsaturated bonds per vinyl monomer molecule on the average, wherein the monofunctional vinyl monomer is an alkoxymethyl (meth)acrylamide of the formula (III):

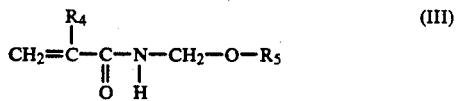

(III)

wherein $R_4$ is hydrogen or methyl, and $R_5$ is an alkyl group having 8 or less carbon atoms or a cycloalkyl group having 8 or less carbon atoms, the content of alkoxymethyl (meth)acrylamide of formula (III) being 20 to 80% by weight of vinyl monomer (c); and (d) 0.1 to 10 parts by weight of antimony trioxide particles having an average diameter of 0.1 μm or smaller;

(e) 0.01 to 10 parts by weight of a photo-polymerizing initiator, wherein the total amount of components (a), (b), (c), (d) and (e) is 100 parts by weight.

4. A flame-resistant photo-curing resin composition recited in claim 3, wherein the acrylic thermoplastic polymer consists essentially of:

15 to 30% by weight of methacrylic acid,
2 to 25% by weight of styrene,
10 to 40% by weight of alkyl acrylate with an alkyl group having 1 to 8 carbon atoms, and
30 to 65% by weight of methyl methacrylate.

* * * * *